(12) United States Patent
Miao et al.

(10) Patent No.: US 10,593,673 B2
(45) Date of Patent: Mar. 17, 2020

(54) NANOSHEET WITH SINGLE EPITAXIAL STACK FORMING OFF-SET DUAL MATERIAL CHANNELS FOR GATE-ALL-AROUND CMOS

(71) Applicant: International Business Machines Corporation, Armonk, NY (US)

(72) Inventors: Xin Miao, Guilderland, NY (US); Jingyun Zhang, Albany, NY (US); Alexander Reznicek, Troy, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/980,250

(22) Filed: May 15, 2018

(65) Prior Publication Data

US 2019/0355723 A1 Nov. 21, 2019

(51) Int. Cl.
*H01L 29/00* (2006.01)
*H01L 29/06* (2006.01)
(Continued)

(52) U.S. Cl.
CPC .. *H01L 27/0922* (2013.01); *H01L 21/823807* (2013.01); *H01L 29/0665* (2013.01);
(Continued)

(58) Field of Classification Search
CPC ............ H01L 29/78696; H01L 29/161; H01L 29/42392; H01L 27/092; H01L 27/0922; H01L 21/823807; H01L 21/823814; H01L 21/823821; H01L 29/6681; H01L 29/775; H01L 29/42376; H01L 29/7853; H01L 29/6653; H01L 29/7843; H01L 29/66818; H01L 29/66439; H01L 29/66787; H01L 29/78684; H01L 29/66742; H01L 29/1054; H01L 29/7849; H01L 29/42384; H01L 2924/1025; H01L 2924/10252; H01L 2924/10253; H01L 2924/12071;
(Continued)

(56) References Cited

U.S. PATENT DOCUMENTS 9,761,586 B2 9/2017 Ching et al.
9,847,390 B1 12/2017 Xie et al.
(Continued)

OTHER PUBLICATIONS

Cheng, K., et al., "High Performance Extremely Thin SOI (ETSOI) Hybrid CMOS with Si Channel NFET and Strained SiGe Channel PFET", Electron Devices Meeting (IEDM) IEEE International, Date of Conference: Dec. 10-13, 2012, 4 pages.
(Continued)

*Primary Examiner* — Natalia A Gondarenko
(74) *Attorney, Agent, or Firm* — Scully, Scott, Murphy & Presser, P.C.; L. Jeffrey Kelly, Esq.

(57) ABSTRACT

A semiconductor structure is provided in which an nFET nanosheet stack of suspended silicon channel material nanosheets is present in an nFET device region and a pFET nanosheet stack of suspended silicon germanium alloy channel material nanosheets is present in a pFET device region. The silicon channel material nanosheets of the nFET nanosheet stack are off-set by one nanosheet from the silicon germanium alloy channel material nanosheets of the pFET nanosheet stack.

14 Claims, 8 Drawing Sheets

(51) Int. Cl.

| | | |
|---|---|---|
| *H01L 29/12* | (2006.01) | |
| *H01L 29/66* | (2006.01) | |
| *H01L 29/772* | (2006.01) | |
| *H01L 29/78* | (2006.01) | |
| *H01L 27/06* | (2006.01) | |
| *H01L 21/8238* | (2006.01) | |
| *H01L 27/092* | (2006.01) | |
| *H01L 29/423* | (2006.01) | |
| *H01L 29/161* | (2006.01) | |
| *H01L 29/786* | (2006.01) | |
| *H01L 21/8232* | (2006.01) | |

(52) U.S. Cl.
CPC ...... *H01L 29/161* (2013.01); *H01L 29/42392* (2013.01); *H01L 29/78696* (2013.01)

(58) Field of Classification Search
CPC ... H01L 2924/1306; H01L 2924/13063; H01L 2924/13085; H01L 2924/13086; H01L 29/66621; H01L 29/66575; H01L 29/78687; H01L 29/78651; H01L 29/4908; H01L 29/66545; H01L 29/0673; H01L 21/02378; H01L 21/02381; H01L 21/02428; H01L 21/02444; H01L 21/0245; H01L 21/02496; H01L 21/02505; H01L 21/02507; H01L 21/02518; H01L 21/02527; H01L 21/02529; H01L 21/02532; H01L 21/20; H01L 21/2033; H01L 21/3215; H01L 21/32155; H01L 21/47573; H01L 21/23857; H01L 21/82385; H01L 21/67069; H01L 21/76837; H01L 21/76877; H01L 21/8232; H01L 21/823842; H01L 29/06; H01L 29/0603; H01L 29/0607; H01L 29/0657; H01L 29/0665; H01L 29/0669; H01L 29/0688; H01L 29/0692; H01L 27/0928; H01L 2924/10271; H01L 29/66628; H01L 21/2053; H01L 21/2251; H01L 21/2253; H01L 21/02603; H01L 21/0257; H01L 21/3065

USPC ... 257/351, 347, 24, 369, E27.112, E29.245, 257/E21.561, 27; 438/257, 479, 733, 154

See application file for complete search history.

(56) References Cited

U.S. PATENT DOCUMENTS

| | | | |
|---|---|---|---|
| 9,876,080 | B2 | 1/2018 | Kunert et al. |
| 9,905,672 | B2 | 2/2018 | Wang et al. |
| 9,911,740 | B2* | 3/2018 | Brunco ............ H01L 21/02529 |
| 9,972,701 | B2* | 5/2018 | Kim .................... H01L 29/0673 |
| 2006/0240622 | A1* | 10/2006 | Lee .................... H01L 29/42392 |
| | | | 438/257 |
| 2009/0291540 | A1* | 11/2009 | Zhang ............... H01L 21/26506 |
| | | | 438/229 |
| 2014/0151639 | A1* | 6/2014 | Chang ............... H01L 29/42392 |
| | | | 257/27 |
| 2016/0111335 | A1* | 4/2016 | Brunco ............ H01L 21/02532 |
| | | | 438/218 |
| 2017/0103986 | A1* | 4/2017 | Kim .................... H01L 27/0924 |
| 2018/0047832 | A1 | 2/2018 | Tapily et al. |
| 2018/0053690 | A1 | 2/2018 | Wang et al. |

OTHER PUBLICATIONS

Lee, C. H., et al., "A Comparative Study of Strain and Ge Content in Si1-xGex Channel using Planar FETs, FinFETs, and Strained Relaxed Buffer Layer FinFETs", Electron Devices Meeting (IEDM), 2017 IEEE International, Date of Conference: Jan. 25, 2018, 4 pages.

* cited by examiner

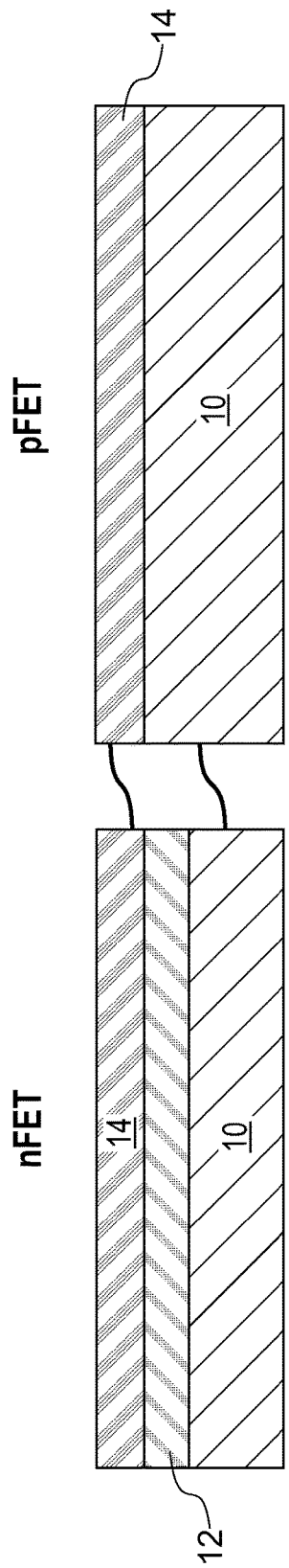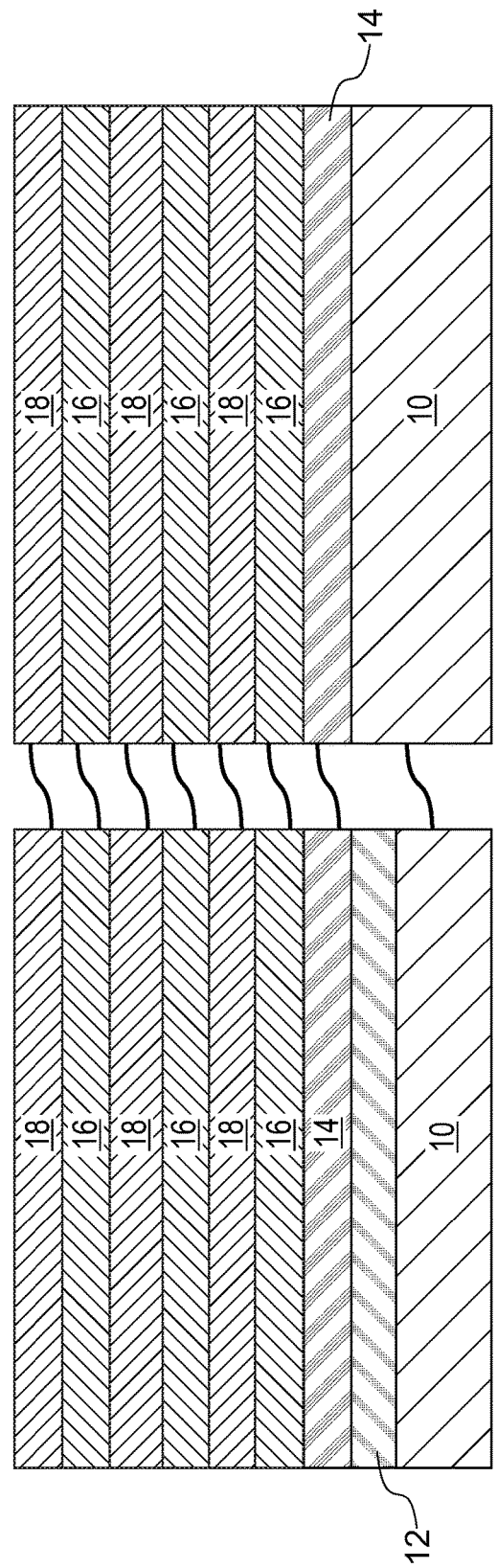

NANOSHEET WITH SINGLE EPITAXIAL STACK FORMING OFF-SET DUAL MATERIAL CHANNELS FOR GATE-ALL-AROUND CMOS

BACKGROUND

The present application relates to a semiconductor structure and a method of forming the same. More particularly, the present application relates to a semiconductor structure that includes an nFET nanosheet stack of suspended silicon channel material nanosheets in an nFET device region and a pFET nanosheet stack of suspended silicon germanium alloy channel material nanosheets in a pFET device region, wherein each silicon channel material nanosheet in the nFET device region is off-set by one nanosheet from each silicon germanium alloy channel material nanosheet in the pFET device region.

The use of non-planar semiconductor devices such as, for example, semiconductor fin field effect transistors (FinFETs) is the next step in the evolution of CMOS devices. One type of non-planar semiconductor device that has been touted as a viable option beyond the 7 nm technology node is a nanosheet containing device. Nanosheet formation relies on the selective removal of one semiconductor material relative to another semiconductor material to form suspended nanosheets for gate-all-around devices. In current nanosheet CMOS processing, silicon is used as the channel material for both the nFET device region and the pFET device region due to process complexity induced by an additional patterning step in the epitaxial channel stack formation.

A silicon germanium alloy material is one promising candidate for use as a semiconductor channel material nanosheet for pFET devices since it provides more flexibility in pFET threshold voltage design, and has improved pFET reliability as compared with a pFET device including a silicon channel material. Dual semiconductor channel material nanostacks are needed in which the pFET device region includes a vertical stack of suspended silicon germanium alloy channel material nanostacks, while the nFET device region includes a vertical stack of suspended silicon channel material nanostacks.

SUMMARY

A semiconductor structure is provided in which an nFET nanosheet stack of suspended silicon channel material nanosheets is present in an nFET device region and a pFET nanosheet stack of suspended silicon germanium alloy channel material nanosheets is present in a pFET device region. In the present application, the silicon channel material nanosheets of the nFET nanosheet stack are off-set by one nanosheet from the silicon germanium alloy channel material nanosheets of the pFET nanosheet stack. This off-set enables the structure to be formed without an additional patterning step which is required in the prior art to form the nFET nanosheet stack and the pFET nanosheet stack, separately.

In one aspect of the present application, a semiconductor structure is provided. In one embodiment of the present application, the semiconductor structure includes an nFET device region including an nFET nanosheet stack of suspended silicon channel material nanosheets located atop a p-type silicon punch through stop layer that is present on a silicon substrate. The semiconductor structure further includes a pFET device region located laterally adjacent the nFET device region and including a pFET nanosheet stack of suspended silicon germanium alloy channel material nanosheets located on an n-type doped silicon germanium alloy layer that is present on the silicon substrate. In accordance with the present application, each silicon channel material nanosheet of the nFET nanosheet stack is off-set by one nanosheet from each silicon germanium alloy channel material nanosheet of the pFET nanosheet stack.

In another aspect of the present application, a method of forming a semiconductor structure is provided. In one embodiment of the present application, the method includes forming a fin structure of alternating layers of a silicon channel material and a silicon germanium alloy channel material on a surface of an n-type doped silicon germanium alloy layer in both an nFET device region and a pFET device region, wherein a p-type silicon punch-stop layer is present beneath the n-type doped silicon germanium alloy layer in the nFET device region. A sacrificial gate structure and a gate spacer layer are formed in both the nFET device region and the pFET device region and on a surface of the fin structure. The gate spacer layer in the nFET device region is etched to provide a first gate spacer, and thereafter an nFET nanosheet stack of alternating nanosheets of the silicon channel material and the silicon germanium alloy channel material is formed on and n-type doped silicon germanium alloy nanosheet by removing physically exposed portions of the fin structure and the n-type doped silicon germanium alloy layer not protected by the sacrificial gate structure and the first gate spacer in the nFET device region. Each silicon germanium alloy channel material nanosheet of the nFET nanosheet stack and the n-type doped silicon germanium alloy nanosheet are then recessed, and thereafter an nFET source/drain region is formed on exposed sidewalls of each silicon channel material nanosheet in the nFET device region. The gate spacer layer in the pFET device region is etched to provide a second gate spacer. Next, a pFET nanosheet stack of alternating nanosheets of the silicon channel material and the silicon germanium alloy channel material is formed on the n-type doped silicon germanium alloy layer by removing physically exposed portions of the fin structure not protected by the sacrificial gate structure and the second gate spacer in the pFET device region. Each silicon channel material nanosheet of the pFET nanosheet stack is then recessed, and thereafter a pFET source/drain region is formed on exposed sidewalls of each silicon germanium alloy nanosheet in the pFET device region. The sacrificial gate structure is then removed from both the nFET device region and the pFET device region, and thereafter the silicon channel material nanosheets in the nFET device region, and the silicon germanium channel material nanosheets in the pFET device region are suspended.

BRIEF DESCRIPTION OF SEVERAL VIEWS OF THE DRAWINGS

FIG. 1 is a cross sectional view of an exemplary semiconductor structure of the present application and during an early stage of fabrication which includes an nFET device region and a laterally adjacent pFET device region, wherein the nFET device region comprises, from bottom to top, a silicon substrate, a p-type silicon punch-stop layer, and an n-type doped silicon germanium alloy layer, while the pFET device region comprises, from bottom to top, the silicon substrate and the n-type doped silicon germanium alloy layer.

FIG. 2 is a cross sectional view of the exemplary semiconductor structure of FIG. 1 after forming a fin structure of alternating layers of a silicon channel material and a silicon germanium alloy channel material on a surface of the n-type doped silicon germanium alloy layer.

DETAILED DESCRIPTION

Figure 3:
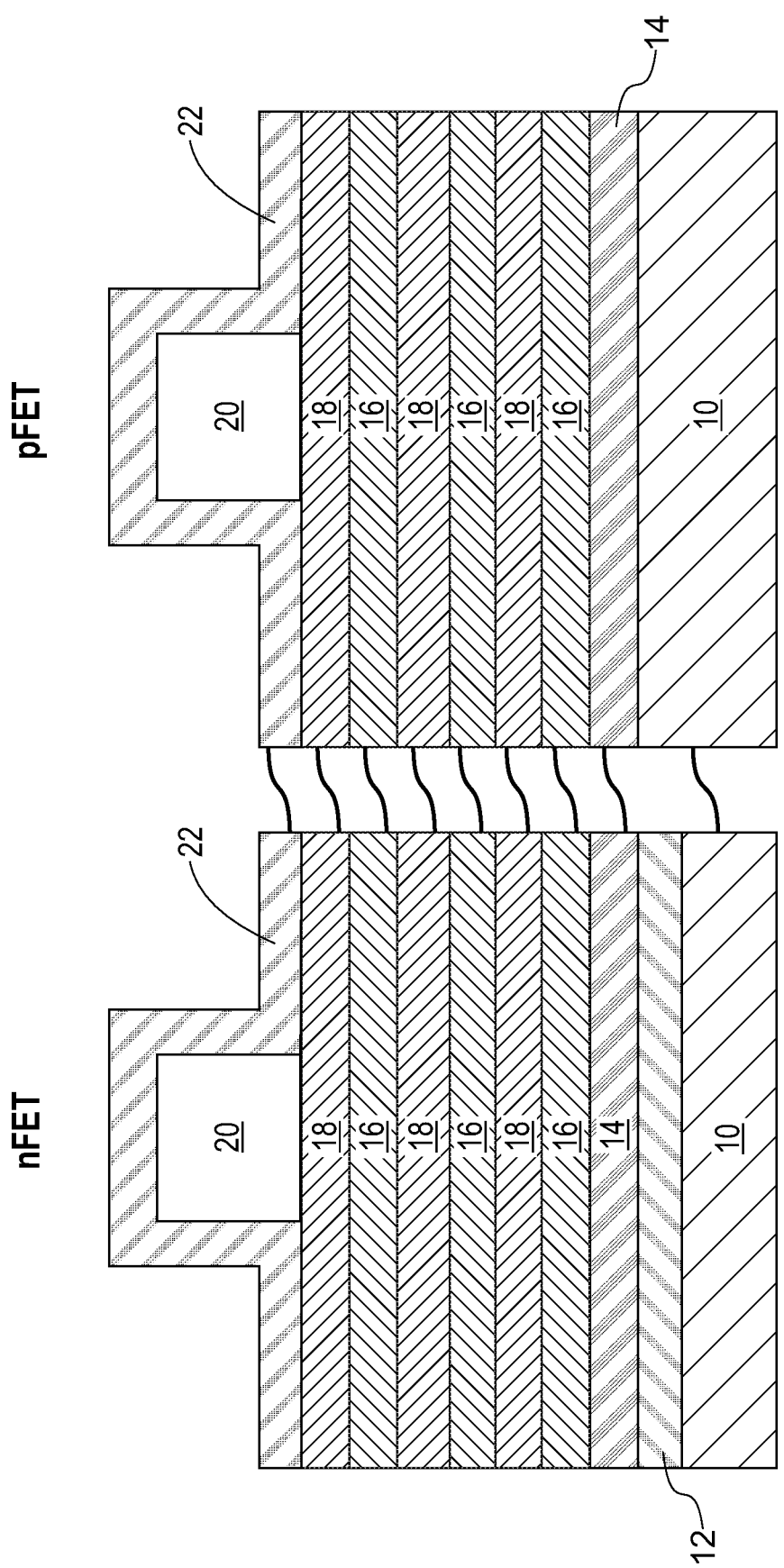
FIG. 3 is a cross sectional view of the exemplary semiconductor structure of FIG. 2 after forming a sacrificial gate structure and a gate spacer layer in both the nFET device region and the pFET device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application and during an early stage of fabrication which includes an nFET device region (i.e., nFET in the drawings) and a laterally adjacent pFET device region (i.e., pFET in the drawings). The nFET device region comprises, from bottom to top, a silicon substrate 10, a p-type silicon punch through stop layer 12, and an n-type doped silicon germanium alloy layer 14, while the pFET device region comprises, from bottom to top, the silicon substrate 10 and the n-type doped silicon germanium alloy layer 14. It is noted that in the drawings, the wavy lines between the nFET device region and the pFET device region emphasize that different device regions are present on a single semiconductor substrate 10. The structure shown in FIG. 1 may be referred to as an initial structure that is used in fabricating the exemplary structure of the present application.

The exemplary semiconductor structure shown in FIG. 1 can be formed by providing a mask (not shown) over a portion of the silicon substrate 10 in which a pFET device is to be subsequently formed, and thereafter introducing a p-type dopant into an upper portion of the silicon substrate 10 that is not protected by the mask to provide the p-type silicon punch through stop layer 12. The term "p-type" refers to the addition of impurities to an intrinsic semiconductor that creates deficiencies of valence electrons. In a silicon-containing semiconductor material such as silicon, examples of p-type dopants, i.e., impurities, include, but are not limited to, boron, aluminum, gallium and indium. The concentration of p-type dopant that can be present in the p-type silicon punch through stop layer 12 is typically from 1E17 atoms/cm$^3$ to 1E20 atoms/cm$^3$.

The introducing of the p-type dopant into the upper portion of silicon substrate 10 may be performed utilizing techniques that are well known to those skilled in the art including, for example, ion implantation, gas phase doping or out-diffusion of a p-type dopant from a sacrificial material containing the p-type dopant. After forming the p-type silicon punch through stop layer 12, the mask can be removed from the silicon substrate 10, and then the n-type doped silicon germanium alloy layer 14 is formed on a physically exposed surface of the p-type silicon punch through stop layer 12 in the nFET device region and on a physically exposed surface of the silicon substrate 10 in the pFET device region.

The n-type doped silicon germanium alloy layer 14 is a continuous layer that can be formed utilizing an epitaxial growth (or epitaxial deposition) process; the n-type dopant is typically, but necessarily always, introduced in-situ during the epitaxial growth process itself. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment of the present application, the n-type dopant present in the n-type doped silicon germanium alloy layer 14 is phosphorus. The concentration of n-type dopant in the n-type doped silicon germanium alloy layer 14 is typically from 1E17 atoms/cm$^3$ to 1E20 atoms/cm$^3$. The silicon germanium alloy that provides the n-type doped silicon germanium alloy layer 14 may contain from 20 atomic percent to 60 atomic percent germanium; the remainder of the alloy, up to 100%, includes silicon.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. The n-type doped silicon germanium alloy layer 14 thus has an epitaxially relationship with the p-type silicon punch through stop layer 12 and the silicon substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the n-type doped silicon germanium alloy layer 14 can be performed utilizing well known precursor gas or precursor gas mixture. Carrier gases like hydrogen, nitrogen, helium and argon can also be used. An n-type dopant may be present during the epitaxial growth process or it can be introduced after epitaxial growth utilizing one of the techniques mentioned above for forming the p-type silicon punch through stop layer 12.

Referring now to FIG. 2, there is illustrated the exemplary semiconductor structure of FIG. 1 after forming a fin structure of alternating layers of a silicon channel material 16 and a silicon germanium alloy channel material 18 on a surface of the n-type doped silicon germanium alloy layer 14. The fin structure is a continuous fin structure that is present in both the nFET device region and the pFET device region. Although a single fin structure is described and illustrated, a plurality of fin structures each containing a vertical stack of alternating layers of silicon channel material 16 and a silicon germanium alloy channel material 18 can be formed. In such an embodiment, each fin structure is orientated parallel to one another.

The formation of the fin structure includes forming a semiconductor material stack upon the n-type doped silicon germanium alloy layer 14 and then patterning the semiconductor material stack to form the fin structure. Patterning may be performed by lithography and etching or any other patterning method known to those skilled in the art including, for example, a sidewall-image transfer (SIT) process.

The term "fin structure" denotes a continuous structure including a pair of vertical sidewalls that are parallel to each other. As used herein, a surface is "vertical" if there exists a vertical plane from which the surface does not deviate by more than three times the root mean square roughness of the surface. The fin structure may have a height from 10 nm to 100 nm, a width from 4 nm to 30 nm, and a length from 100 nm to 2000 nm. Other heights and/or widths and/or lengths may also be used as the dimensions of fin structure.

The semiconductor material stack that is employed in forming the fin structure is composed of alternating layers of silicon channel material 16 and silicon germanium alloy channel material 18 which alternate one atop the other; the alternating layers of silicon channel material 16 and silicon germanium alloy channel material 18 are also present in the fin structure. In one example, the semiconductor material stack includes three layers of silicon channel material 16 and three layers of silicon germanium alloy channel material 18. The semiconductor material stack that can be employed in the present application is not limited to such a semiconductor material stack. Instead, the semiconductor material stack can include any number of layers of silicon channel material 16 and corresponding layers of silicon germanium alloy channel material 18. The alternating layers of silicon channel material 16 and silicon germanium alloy channel material 18 can be formed by sequential epitaxial growth of each layer of the semiconductor material stack.

Each layer of silicon channel material 16 may have a thickness from 5 nm to 12 nm, while each layer of silicon germanium alloy channel material 18 may have a thickness from 5 nm to 12 nm. Each layer of silicon channel material 16 may have a thickness that is the same as, or different from, a thickness of each layer of silicon germanium alloy channel material 18. Each layer of silicon germanium alloy channel material 18 may contain from 20 atomic percent to 60 atomic percent germanium; the remainder of the alloy, up to 100%, includes silicon. In some embodiments, each layer of silicon germanium alloy channel material 18 has a same germanium content as the n-type doped silicon germanium alloy layer 14.

Referring now to FIG. 3, there is illustrated the exemplary semiconductor structure of FIG. 2 after forming a sacrificial gate structure 20 and a gate spacer layer 22 in both the nFET device region and the pFET device region. Although a single sacrificial gate structure 20 is shown in each device region, it is possible to form more than one sacrificial gate structure 20 in each of the device regions.

Each sacrificial gate structure 20 that is formed is located on a first side and a second side of the fin structure (not shown), and spans across a topmost surface of a portion of the fin structure. Each sacrificial gate stack 20 thus straddles over a portion of the fin structure. Each sacrificial gate structure 20 may include a single sacrificial material or a stack of two or more sacrificial materials (i.e., each sacrificial gate structure 20 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide each sacrificial gate structure 20.

The dielectric spacer material layer 22 can be formed by deposition of a dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD).

Figure 4:
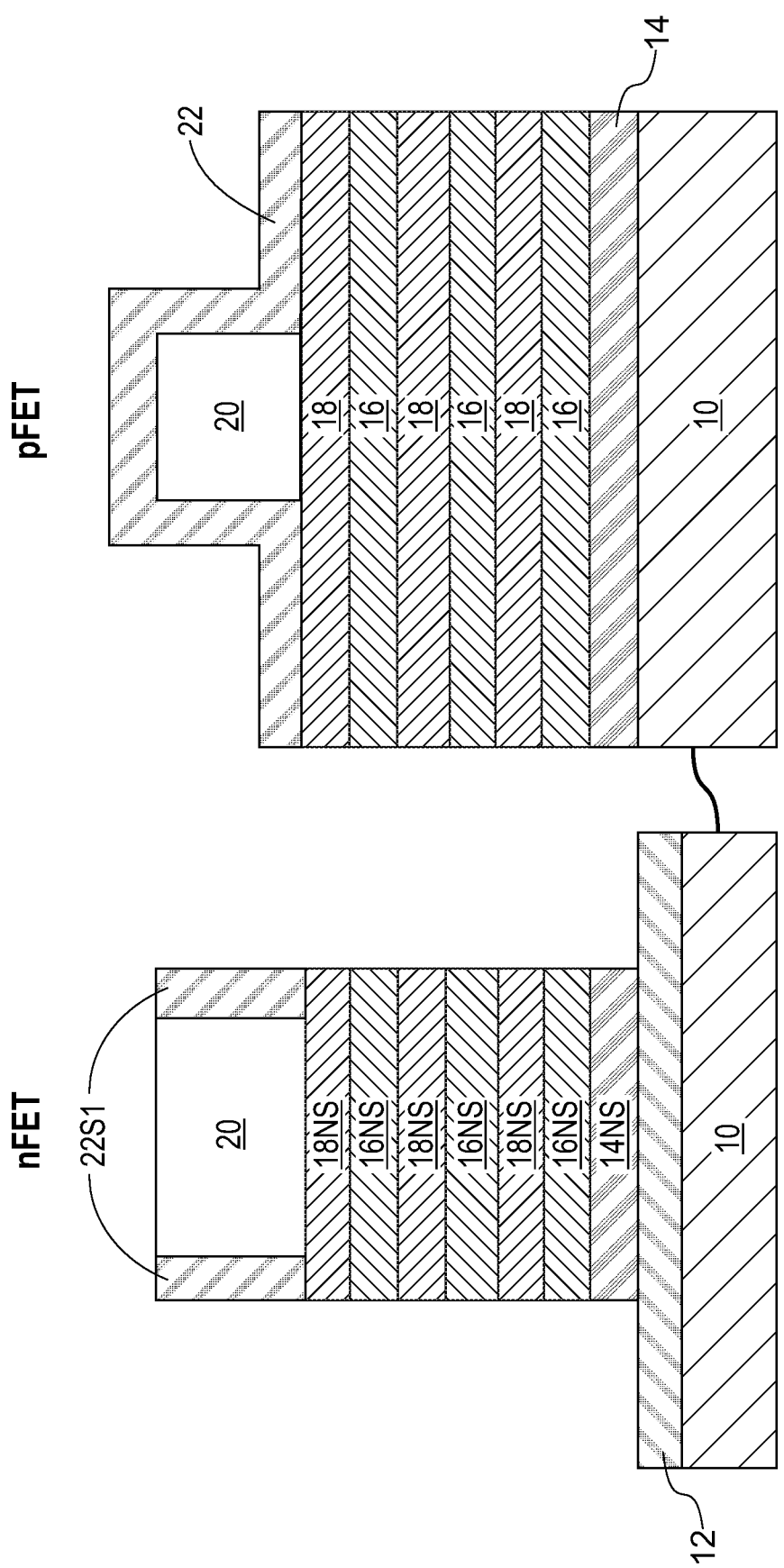
FIG. 4 is a cross sectional view of the exemplary semiconductor structure of FIG. 3 after etching the gate spacer layer in the nFET device region to provide a first gate spacer, and forming an nFET nanosheet stack of alternating nanosheets of the silicon channel material and the silicon germanium alloy channel material on an n-type doped silicon germanium alloy nanosheet by removing physically exposed portions of the fin structure and the n-type doped silicon germanium alloy layer not protected by the sacrificial gate structure and the first gate spacer in the nFET device region.

Referring now to FIG. 4, there is illustrated the exemplary semiconductor structure of FIG. 3 after etching the gate spacer layer 22 in the nFET device region to provide a first gate spacer 22S1, and forming an nFET nanosheet stack of alternating nanosheets of silicon channel material 16NS and silicon germanium alloy channel material 18NS on an n-type doped silicon germanium alloy nanosheet 14NS by removing physically exposed portions of the fin structure and the n-type doped silicon germanium alloy layer 14 not protected by the sacrificial gate structure 20 and the first gate spacer 22S1 in the nFET device region.

Figure 5:
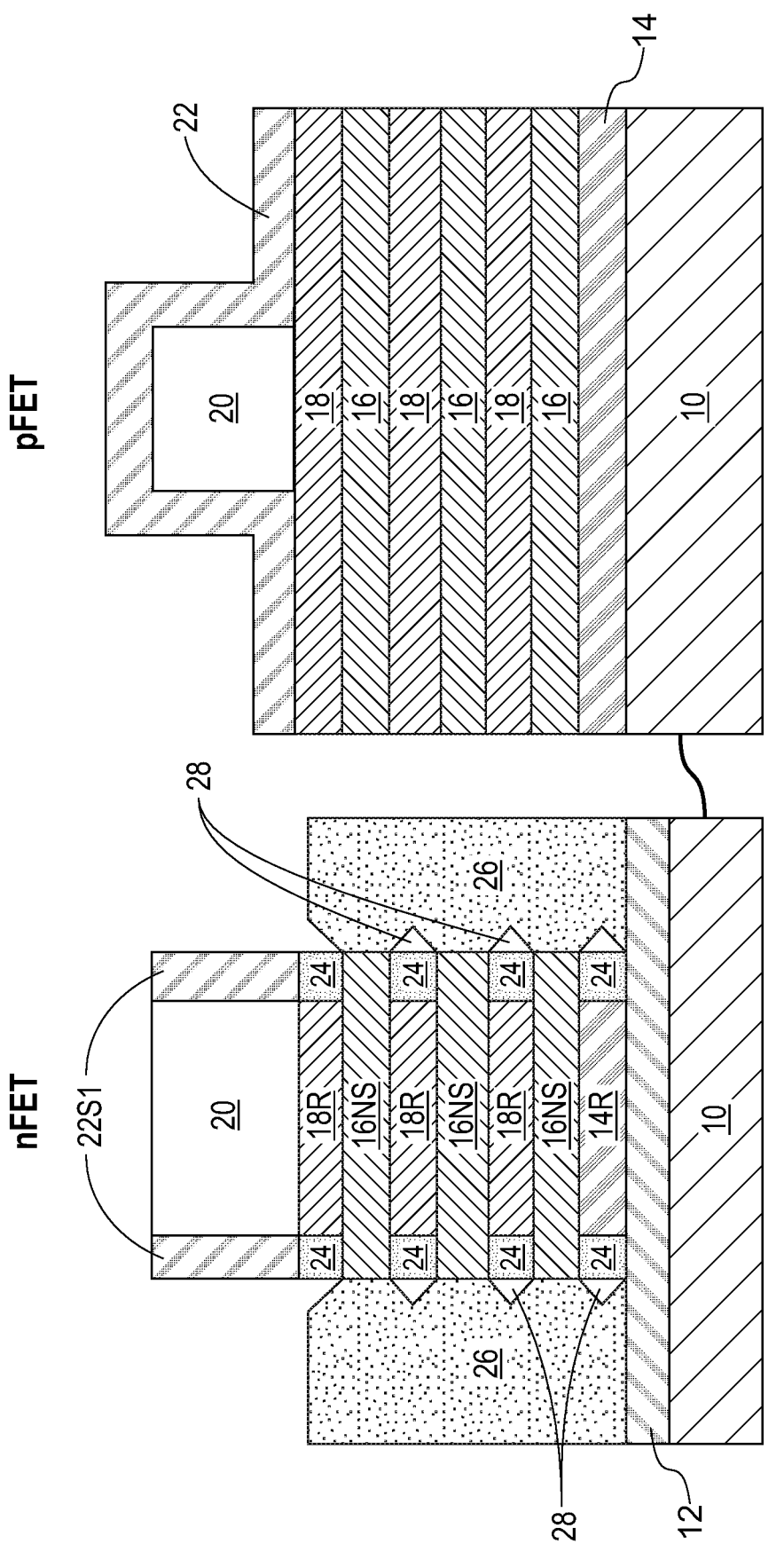
FIG. 5 is a cross sectional view of the exemplary semiconductor structure of FIG. 4 after recessing each silicon germanium alloy channel material nanosheet of the nFET nanosheet stack and the n-type doped silicon germanium alloy nanosheet, forming an nFET inner spacer, and forming an nFET source/drain region.
Figure 6:
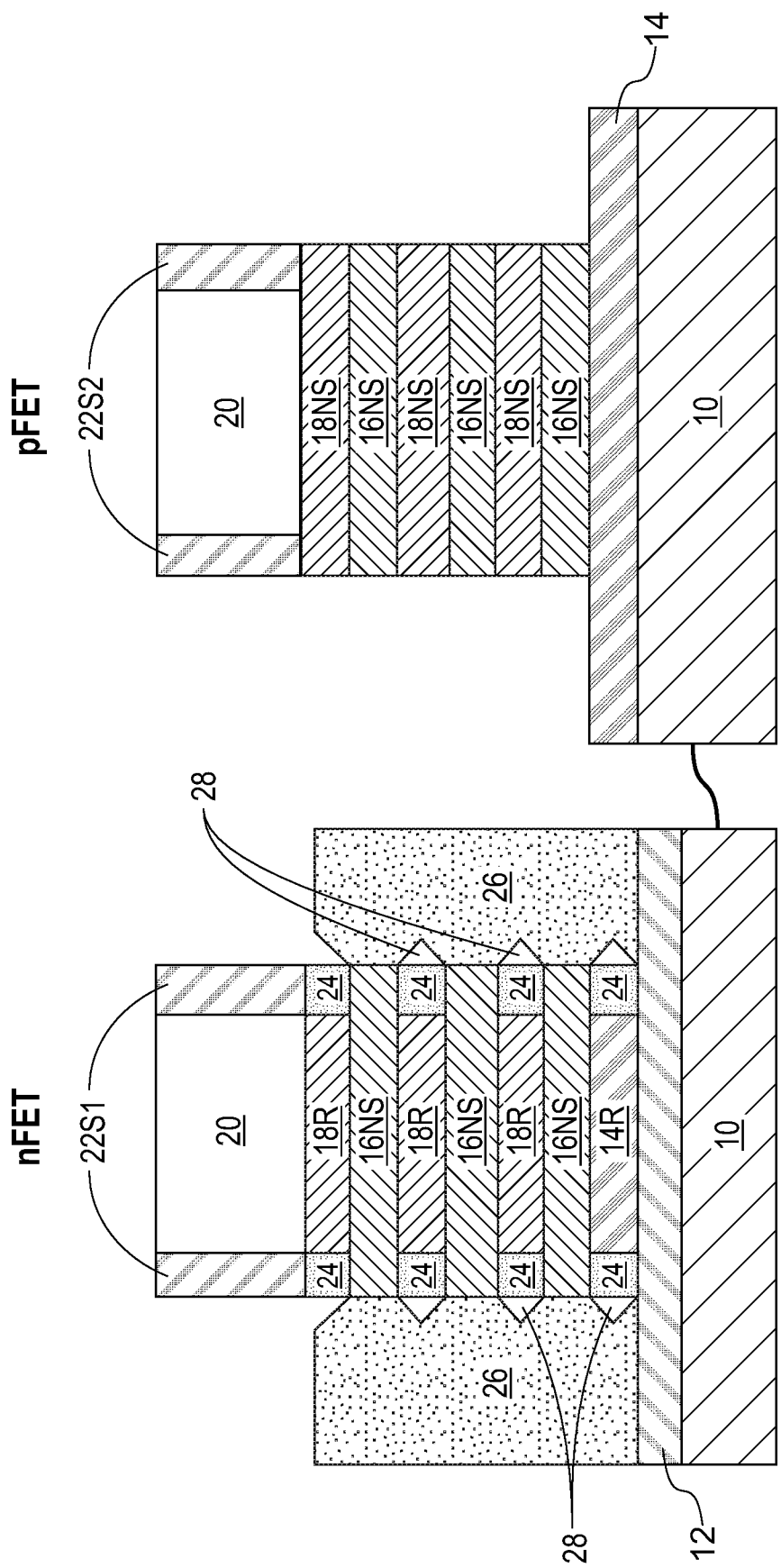
FIG. 6 is a cross sectional view of the exemplary semiconductor structure of FIG. 5 after etching the gate spacer layer in the pFET device region to provide a second gate spacer, and forming a pFET nanosheet stack of alternating nanosheets of the silicon channel material and the silicon germanium alloy channel material on the n-type doped silicon germanium alloy layer by removing physically exposed portions of the fin structure not protected by the sacrificial gate structure and the second gate spacer in the pFET device region.
Figure 7:
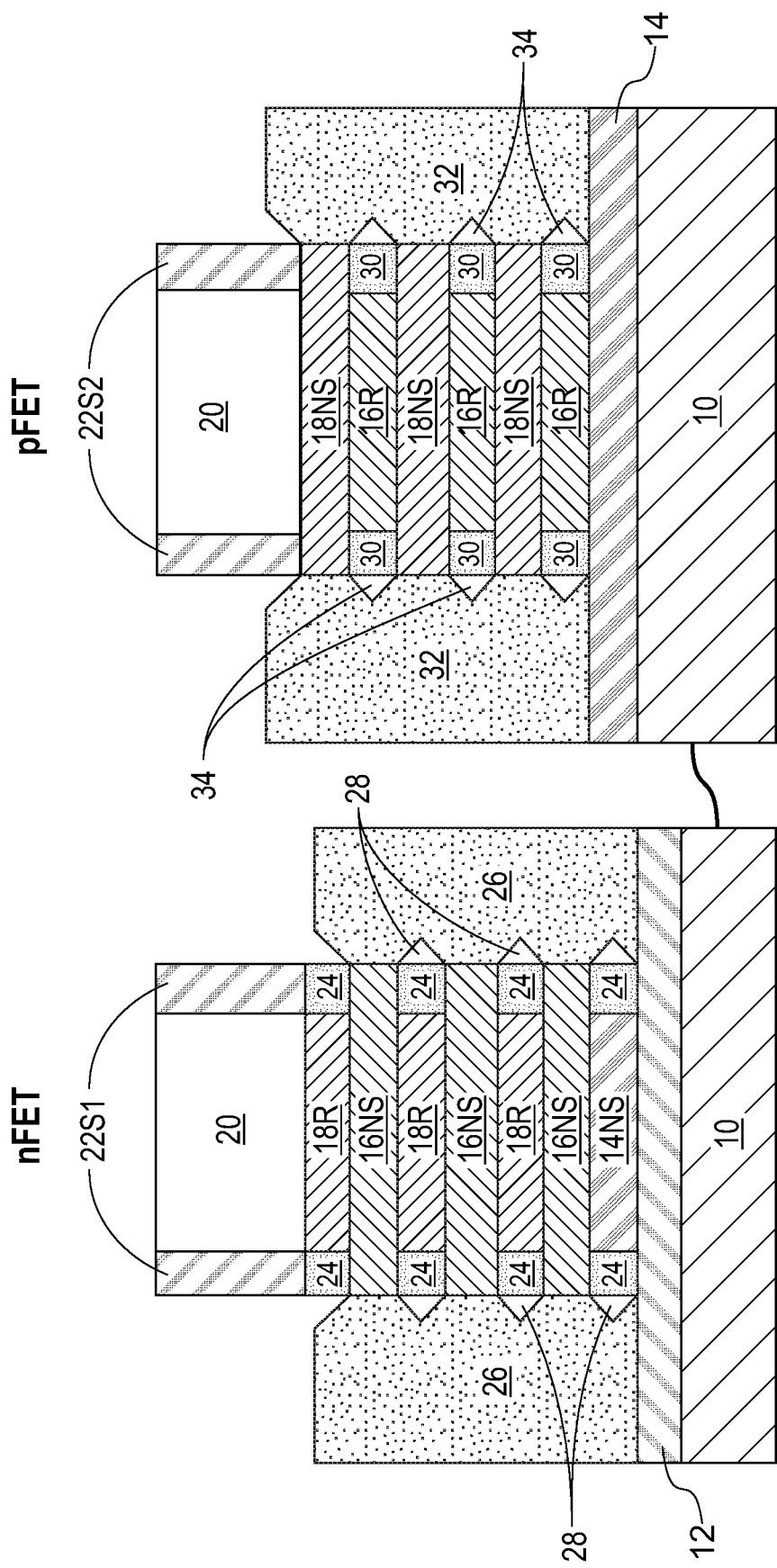
FIG. 7 is a cross sectional view of the exemplary semiconductor structure of FIG. 6 after recessing each silicon channel material nanosheet of the pFET nanosheet stack, forming an pFET inner spacer, and forming a pFET source/drain region.

In the illustrated embodiment, the pFET device region would be protected by a block mask (not shown), while the nFET device region is processed as shown in FIGS. 4 and 5. After forming the processed structure of FIG. 5 in the nFET device region, the block mask is removed from the pFET device region, and another block mask (not shown) would be formed over the processed structure of FIG. 5 in the nFET device region, and thereafter the pFET device region would be processed as shown in FIGS. 6-7. The another block mask would then be removed from the nFET device region after forming the processed structure of FIG. 7 in the pFET device region. In other embodiments, the pFET device region would be processed as shown in FIGS. 6-7, and thereafter the nFET device region would be processed as shown in FIGS. 4-5.

The removal of the physically exposed portions of the fin structure and the n-type doped silicon germanium alloy layer 14 not covered by the sacrificial gate structure 20 and the first gate spacer 22S1 can be performed utilizing an anisotropic etching process such as, for example, reactive ion etching (RIE). This anisotropic etching process that occurs within the nFET device region stops on a surface of the p-type doped punch through stop layer 12. Portions of the fin structure and n-type doped silicon germanium alloy layer 14 remain beneath the sacrificial gate structure 20 and the first gate spacer 22S1 in the nFET device region. The remaining portion of the fin structure that is presented beneath the sacrificial gate structure 20 and the first gate spacer 22S1 in the nFET device region can be referred to as an nFET nanosheet stack, while the remaining portion of the n-type doped silicon germanium alloy layer 14 that is presented beneath the sacrificial gate structure 20 and the first gate spacer 22S1 in the nFET device region can be referred to herein as an n-type doped silicon germanium alloy nanosheet 14NS.

The nFET nanosheet stack includes alternating nanosheets of remaining portions of each layer of silicon channel material (referred to herein as silicon channel material nanosheet 16NS and remaining portions of each layer of silicon germanium alloy channel material (referred to herein as silicon germanium alloy channel material nanosheet 18NS).

Each nanosheet of the nFET nanosheet stack has a thickness as mentioned above for the individual layers of silicon channel material 16 and individual layers of silicon germanium alloy channel material 18 of the fin structure, and a nanosheet width from 10 nm to 200 nm. The width of the n-type doped silicon germanium alloy nanosheet 14NS is the same as the width of each nanosheet of the nFET nanosheet stack.

At this point of the present application and as illustrated in FIG. 4, the sidewalls of each silicon channel material nanosheet 16NS of the nFET nanosheet stack are vertically aligned to sidewalls of each silicon germanium alloy channel material nanosheet 18NS of the nFET nanosheet stack, and the vertically aligned sidewalls of the nFET nanosheet stack are vertically aligned to an outmost sidewall of the first gate spacer 22S1. The nFET nanosheet stack also has outermost sidewalls that are vertically aligned to the outermost sidewalls of the n-type doped silicon germanium alloy nanosheet 14NS.

Referring now to FIG. 5, there is illustrated the exemplary semiconductor structure of FIG. 4 after recessing each silicon germanium alloy channel material nanosheet 18NS of the nFET nanosheet stack and the n-type doped silicon germanium alloy nanosheet 14NS, forming an nFET inner spacer 24, and forming an nFET source/drain region 26.

The remaining portion of the each silicon germanium alloy channel material nanosheet 18NS of the nFET nanosheet stack after recessing is referred to herein as a recessed silicon germanium alloy channel material nanosheet 18R and the remaining portion of n-type doped silicon germanium alloy nanosheet 14NS after the recessing is referred to herein as a recessed p-type doped silicon germanium alloy nanosheet 14R. Each recessed silicon germanium alloy channel material nanosheet 18R has a width that is less than the original width of each silicon germanium alloy channel material nanosheet 18NS. Also, the recessed p-type doped silicon germanium alloy nanosheet 14R has a width that is less than the original width of n-type doped silicon germanium alloy nanosheet 14NS.

The recessing of each silicon germanium alloy channel material nanosheet 18NS of the nFET nanosheet stack provides a gap (not specifically shown) between each neighboring pair of silicon channel material nanosheets 16NS within the nFET nanosheet stack. The recessing of the n-type doped silicon germanium alloy nanosheet 14NS provides a gap between the bottommost silicon channel material nanosheet 16NS and the p-type silicon punch through stop layer 12.

The recessing of each silicon germanium alloy channel material nanosheet 18NS of the nFET nanosheet stack and the n-type doped silicon germanium alloy nanosheet 14NS may be performed utilizing a lateral etching process that is selective in removing physically exposed end portions of each silicon germanium alloy channel material nanosheet 18NS and the n-type doped silicon germanium alloy nanosheet 14NS relative to each silicon channel material nanosheet 16NS.

The nFET inner spacer 24 is then formed within the gaps by depositing an inner dielectric spacer material and etching the deposited inner dielectric spacer material. In one example, the inner dielectric spacer material is composed of silicon nitride. As is shown, the nFET inner spacer 24 that is formed in the gaps between each neighboring pair of vertically stacked silicon channel material nanosheets 16NS directly contacts a sidewall of one of the recessed silicon germanium alloy channel material nanosheet 18R, while the bottommost nFET inner spacer 24 directly contact a sidewall of the recessed n-type doped silicon germanium alloy nanosheet 14R. The nFET inner spacer 24 that is formed has an outermost sidewall that is vertically aligned to the outermost sidewall of each silicon channel material nanosheet 16NS.

Each nFET source/drain (S/D) region 26 includes a semiconductor material and an n-type dopant, as defined above. The semiconductor material that provides each nFET S/D region 26 can be selected from any semiconductor material that has semiconducting properties. In some embodiments of the present application, the semiconductor material that provides each nFET S/D region 26 may be composed of silicon, and the n-type dopant is phosphorus.

Each nFET S/D region 26 can be epitaxially grown from exposed sidewalls of each silicon channel material nanosheet 16NS. In one embodiment, the dopant that can be present in the each nFET S/D region 26 can be introduced into the precursor gas that provides each nFET S/D region 26. In another embodiment, the dopant can be introduced into an intrinsic semiconductor layer by utilizing one of ion implantation or gas phase doping. The n-type dopant concentration in each nFET S/D region 26 is typically from $5 \times 10^{20}$ atoms/cm$^3$ to $5 \times 10^{21}$ atoms/cm$^3$. In some embodiments, each nFET S/D region 26 has a faceted upper surface. As is shown, a gap 28 is present between each nFET S/D region 26 and an outermost sidewall of each nFET inner spacer 24.

Referring now to FIG. 6, there is illustrated the exemplary semiconductor structure of FIG. 5 after etching the gate spacer layer 22 in the pFET device region to provide a second gate spacer 22S2, and forming a pFET nanosheet stack of alternating nanosheets of a silicon channel material 16NS and a silicon germanium alloy channel material 18NS on the n-type doped silicon germanium alloy layer 14 by removing physically exposed portions of the fin structure not protected by the sacrificial gate structure 20 and the second gate spacer 22S2 in the pFET device region. Prior to performing the etch that provides the second gate spacer 22S2, a block mask (not shown) is formed protecting the processed nFET device region.

The removal of the physically portions of the fin structure not covered by the sacrificial gate structure 20 and the second gate spacer 22S2 can be performed utilizing an anisotropic etching process such as, for example, reactive ion etching (RIE). This anisotropic etching process that occurs within the pFET device region stops on a surface of the n-type silicon germanium alloy layer 14. Portions of the fin structure remain beneath the sacrificial gate structure 20 and the second gate spacer 22S2 in the pFET device region. The remaining portion of the fin structure that is presented beneath the sacrificial gate structure 20 and the second gate spacer 22S2 in the pFET device region can be referred to as an pFET nanosheet stack.

The pFET nanosheet stack includes alternating nanosheets of remaining portions of each layer of silicon channel material (referred to herein as silicon channel material nanosheet 16NS and remaining portions of each layer of silicon germanium alloy channel material (referred to herein as silicon germanium alloy channel material nanosheet 18NS).

Each nanosheet of the pFET nanosheet stack has a thickness as mentioned above for the individual layers of silicon channel material 16 and individual layers of silicon germanium alloy channel material 18 of the fin structure, and a nanosheet width from 10 nm to 200 nm.

At this point of the present application and as illustrated in FIG. 6, the sidewalls of each silicon channel material nanosheet 16NS of the pFET nanosheet stack are vertically aligned to sidewalls of each silicon germanium alloy channel material nanosheet 18NS of the pFET nanosheet stack, and the vertically aligned sidewalls of the pFET nanosheet stack are vertically aligned to an outmost sidewall of the second gate spacer 22S2. The pFET nanosheet stack is located on a surface of the n-type doped silicon germanium alloy layer 14.

Referring now to FIG. 7, there is illustrated the exemplary semiconductor structure of FIG. 6 after recessing each silicon channel material nanosheet 16NS of the pFET nanosheet stack, forming an pFET inner spacer 30, and forming a pFET source/drain region 32.

The remaining portion of the each silicon channel material nanosheet 16NS of the pFET nanosheet stack after recessing is referred to herein as a recessed silicon channel material nanosheet 16R. Each recessed silicon channel material nanosheet 16R has a width that is less than the original width of each silicon channel material nanosheet 16NS. The recessing of each silicon channel material nanosheet 16NS of the pFET nanosheet stack provides a gap (not specifically shown) between each neighboring pair of silicon germanium alloy channel material nanosheets 18NS within the pFET nanosheet stack. A gap is also provided between the bottommost recessed silicon channel material nanosheet 16R and the n-type silicon germanium alloy layer 14.

The recessing of each silicon channel material nanosheet 16NS of the pFET nanosheet may be performed utilizing a lateral etching process that is selective in removing physically exposed end portions of each silicon channel material nanosheet 16NS relative to each silicon germanium alloy channel material nanosheet 18NS, and the n-type silicon germanium alloy layer 14.

The pFET inner spacer 30 is then formed within the gaps by depositing an inner dielectric spacer material and etching the deposited inner dielectric spacer material. In one example, the inner dielectric spacer material is composed of silicon nitride. As is shown, the pFET inner spacer 30 that is formed in the gaps between each neighboring pair of vertically stacked silicon germanium alloy channel material nanosheets 18NS directly contacts a sidewall of one of the recessed silicon channel material nanosheet 16R, while the bottommost pFET inner spacer 30 directly contact a sidewall of the bottommost recessed silicon channel material nanosheet 16R. The pFET inner spacer 30 that is formed has an outermost sidewall that is vertically aligned to the outermost sidewall of each silicon germanium alloy channel material nanosheet 18NS.

Each pFET source/drain (S/D) region 32 includes a semiconductor material and a p-type dopant, as defined above. The semiconductor material that provides each pFET S/D region 32 can be selected from any semiconductor material that has semiconducting properties. In some embodiments of the present application, the semiconductor material that provides each pFET S/D region 32 may be composed of a silicon germanium alloy, and the p-type dopant is boron.

Each pFET S/D region 32 can be epitaxially grown from exposed sidewalls of each silicon germanium alloy channel material nanosheet 18NS. In one embodiment, the dopant that can be present in the each pFET S/D region 32 can be introduced into the precursor gas that provides each pFET S/D region 32. In another embodiment, the dopant can be introduced into an intrinsic semiconductor layer by utilizing one of ion implantation or gas phase doping. The p-type dopant concentration in each pFET S/D region 32 is typically from $5\times10^{20}$ atoms/cm$^3$ to $5\times10^{21}$ atoms/cm$^3$. In some embodiments, each pFET S/D region 32 has a faceted upper surface. As is shown, a gap 34 is present between each pFET S/D region 32 and an outermost sidewall of each pFET inner spacer 30.

Figure 8:
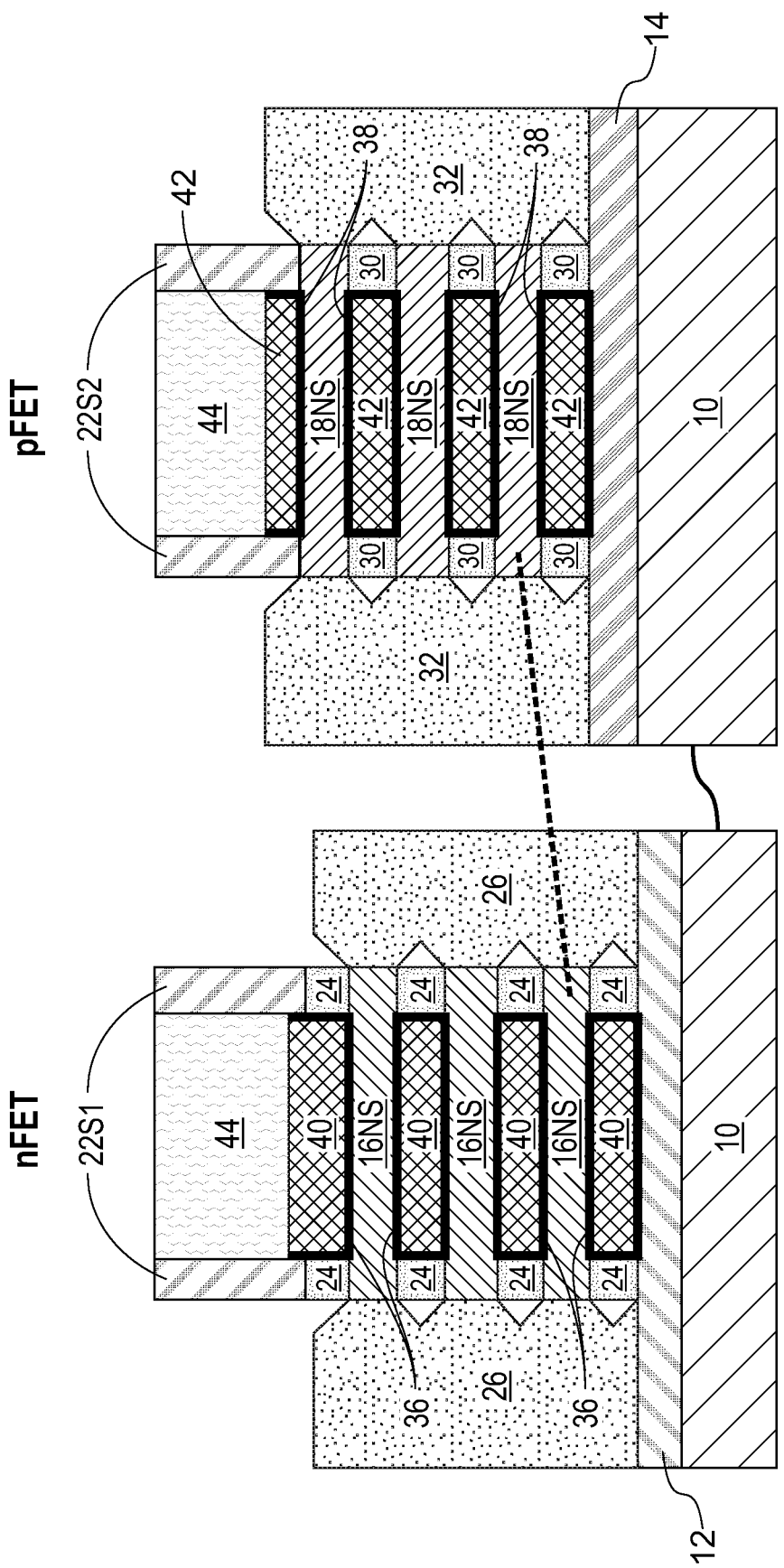
FIG. 8 is a cross sectional view of the exemplary semiconductor structure of FIG. 7 after removing the sacrificial gate structure from both the nFET device region and the pFET device region, suspending the silicon channel material nanosheets in the nFET device region and suspending the silicon germanium channel material nanosheets in the pFET device region, and forming an nFET functional gate structure surrounding a portion of each suspended silicon channel material nanosheet and a pFET functional gate structure surrounding a portion of each suspending silicon germanium channel material nanosheet.

Referring now to FIG. 8, there is illustrated the exemplary semiconductor structure of FIG. 7 after removing the sacrificial gate structure 20 from both the nFET device region and the pFET device region, suspending the silicon channel material nanosheets 16NS in the nFET device region and suspending the silicon germanium channel material nanosheets 18NS in the pFET device region, and forming an nFET functional gate structure (36, 40) surrounding a portion of each suspended silicon channel material nanosheet 16NS and a pFET functional gate structure (38, 42) surrounding a portion of each suspending silicon germanium channel material nanosheet 18NS.

Although not shown, an interlayer dielectric (ILD) material is formed atop the nFET S/D regions 26 and the pFET S/D regions 32 and laterally surrounding each sacrificial gate structure 20. The ILD material may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material. The use of a self-planarizing dielectric material as the ILD material may avoid the need to perform a subsequent planarizing step. In one embodiment, the ILD material can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material, a planarization process or an etch back process follows the deposition of the dielectric material that provides the ILD material.

Each sacrificial gate structure 20 is then removed utilizing one or more etching steps to provide an upper gate cavity that is located between the first gate spacers 22S1 and the second gate spacers 22S2. Each recessed silicon germanium alloy channel material nanosheet 18R is then removed from the nFET device region utilizing an etching process so as to suspend each of the silicon channel material nanosheets 16NS within the nFET device region. Each recessed silicon channel material nanosheet 16R is removed from the pFET device region utilizing an etching process so as to suspend each of the silicon germanium alloy channel material nanosheets 18NS within the pFET device region. The suspending of the particular channel material nanosheets in the nFET device region and the pFET device region may be performed in any order.

An nFET functional gate structure (36, 40) is formed surrounding physically exposed surfaces of each silicon channel material nanosheet 16NS and within the upper gate cavity, while a pFET functional gate structure (38, 42) is formed surrounding physically exposed surfaces of each silicon germanium alloy channel material nanosheet 18NS and within the upper gate cavity. The nFET functional gate structure and the pFET functional gate structure can be formed in any order.

By "functional gate structure" it is meant a permanent gate structure used to control output current (i.e., flow of carriers in the channel) of a semiconducting device through electrical or magnetic fields. The nFET and pFET functional gate structures may include a gate dielectric material (36, 38) and a gate conductor material (40, 42). The gate dielectric material (36, 38) may include a dielectric oxide, a dielectric nitride, and/or a dielectric oxynitride. In one example, the gate dielectric material (36, 38) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material (36, 38). The gate dielectric material 36 of the nFET functional gate structure may be the same as, or different from, the gate dielectric material 38 of the pFET functional gate structure.

The gate dielectric material (36, 38) can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material (36, 38) can have a thickness in a range from 1 nm to 10 nm. Other thicknesses that are lesser than, or greater than, the aforementioned thickness range can also be employed for the gate dielectric material (36, 38).

The gate conductor material (40, 42) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material 40 may comprise an nFET gate metal, while the gate conductor material 42 may comprise a pFET gate metal. The gate conductor material (40, 42) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material (40, 42) can have a thickness from 50 nm to 200 nm. Other thicknesses that are lesser than, or greater than, the aforementioned thickness range can also be employed for the gate conductor material (40, 42).

The functional gate structure can be formed by providing a gate material stack of the gate dielectric material (36, 38) and the gate conductor material (40, 42). A planarization process may follow the formation of the nFET and pFET functional gate material stacks. In some embodiments, and as shown, the nFET functional gate structure (36, 40) and the pFET functional gate structure (38, 42) may be recessed and a dielectric capping material 44 can be formed atop the recessed nFET and pFET functional gate structures. The dielectric capping material 44 can include any dielectric material such as, for example, silicon dioxide, and it may be formed by a deposition process such as, for example, chemical vapor deposition or plasma enhanced chemical vapor deposition.

FIG. 8 (as well as FIG. 9 to follow) depicts a semiconductor structure that includes an nFET device region including an nFET nanosheet stack of suspended silicon channel material nanosheets 16NS located atop p-type silicon punch through stop layer 12 that is present on silicon substrate 10. The semiconductor structure further includes a pFET device region located laterally adjacent the nFET device region and including a pFET nanosheet stack of suspended silicon germanium alloy channel material nanosheets 18NS located on an n-type doped silicon germanium alloy layer 14 that is present on the silicon substrate 10. In accordance with the present application, each silicon channel material nanosheet 16NS in the nFET device region is off-set by one nanosheet from each silicon germanium alloy channel material nanosheet 18NS in the pFET device region; this is represented by the dotted line in FIGS. 8 and 9.

Figure 9:
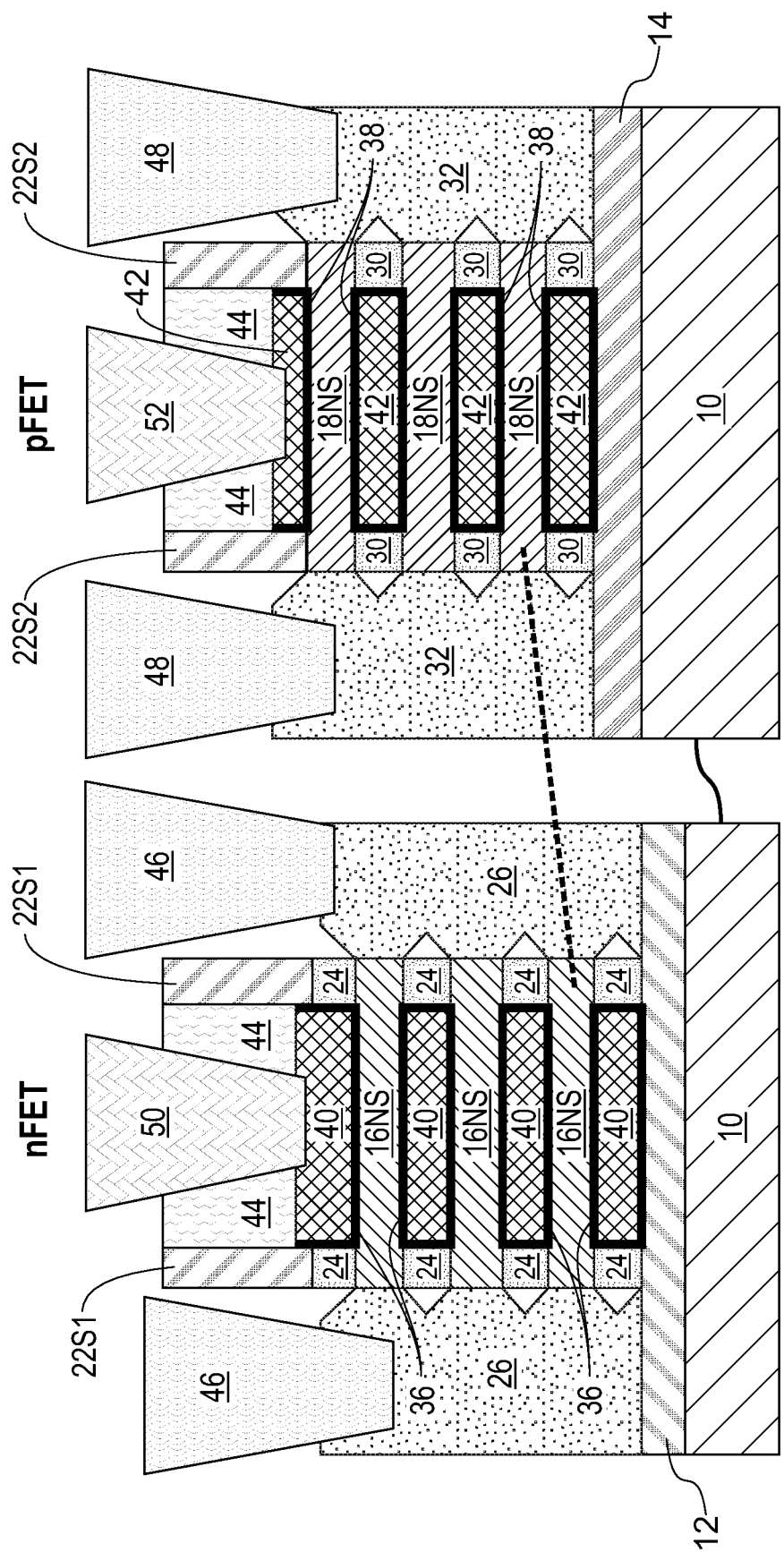
FIG. 9 is a cross sectional view of the exemplary semiconductor structure of FIG. 8 after forming source/drain contact structures and gate contact structures in both the nFET device region and the pFET device region.

Referring now to FIG. 9, there is illustrated the exemplary semiconductor structure of FIG. 8 after forming source/drain contact structures (46, 48) and gate contact structures (50, 52) in both the nFET device region and the pFET device region. The forming of the source/drain contact structures (46, 48) and gate contact structures (50, 52) may include the formation of additional ILD material so as to cover the topmost surface of the dielectric capping material 44, then contact openings can be formed into the ILD material(s) by lithography and etching. Each contact opening is thereafter filled with a contact metal or metal alloy such as, for example, tungsten (W), copper (Cu) aluminum (AL) or cobalt (Co). A planarization process may follow the filling of each contact opening.

In FIG. 9, element 46 is a first source/drain contact structure that contacts a surface of the nFET source/drain region 26, element 48 is a second source/drain contact structure that contacts a surface of the pFET source/drain region 32, element 50 is a first gate contact structure that contacts a surface of the nFET functional gate structure, and element 52 is a second gate contact structure that contacts a surface of the pFET functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   an nFET device region comprising an nFET nanosheet stack of suspended silicon channel material nanosheets located entirely above a p-type silicon punch through stop layer that is present directly on a first portion of a silicon substrate having a first height; and
   a pFET device region located laterally adjacent the nFET device region and comprising a pFET nanosheet stack of suspended silicon germanium alloy channel material nanosheets located entirely above an n-type doped silicon germanium alloy layer that is present directly on a second portion of the semiconductor substrate having a second height that is greater than the first height, wherein each suspended silicon channel material nanosheet in the nFET device region is vertically and horizontally off-set by one nanosheet from each silicon germanium alloy channel material nanosheet in the pFET device region, and the p-type silicon punch through stop layer is vertically and horizontally off-set from the n-type doped silicon germanium alloy layer, and wherein the n-type doped silicon germanium alloy layer has a topmost surface that is coplanar with a bottommost surface of a bottommost silicon channel material nanosheet of the suspended silicon channel material nanosheets and a bottommost surface that directly contacts the second portion of the semiconductor substrate and is coplanar with a topmost surface of the p-type silicon punch through stop layer.

2. The semiconductor structure of claim 1, further comprising an nFET functional gate structure surrounding a portion of each suspended silicon channel material nanosheet, and a pFET functional gate structure surrounding a portion of each suspended silicon germanium alloy channel material nanosheet.

3. The semiconductor structure of claim 2, further comprising an nFET inner spacer located between end portions of each suspended silicon channel material nanosheet, and a pFET inner spacer located between end portions of each suspended silicon germanium alloy channel material nanosheet.

4. The semiconductor structure of claim 3, further comprising an nFET source/drain region on each side of the nFET nanosheet stack and physically contacting a sidewall of each suspended silicon channel material nanosheet, and a pFET source/drain region on each side of the pFET nanosheet stack and physically contacting a sidewall of each suspended silicon germanium alloy channel material nanosheet.

5. The semiconductor structure of claim 4, wherein a gap is present between each nFET inner spacer and the nFET source/drain region, and a gap is present between each pFET inner spacer and the pFET source/drain region.

6. The semiconductor structure of claim 4, wherein the nFET source/drain region is composed of phosphorus-doped silicon, and the pFET source/drain region is composed of a boron doped silicon germanium alloy.

7. The semiconductor structure of claim 2, further comprising a first gate spacer located above a topmost silicon channel material nanosheet of the nFET nanosheet stack and surrounding an upper portion of the nFET functional gate structure that is located on the topmost silicon channel material nanosheet of the nFET nanosheet stack, and a second gate spacer located above a topmost silicon germanium alloy channel material nanosheet of the pFET nanosheet stack and surrounding an entirety of the pFET functional gate structure that is located on the topmost silicon germanium alloy channel material nanosheet of the pFET nanosheet stack.

8. The semiconductor structure of claim 4, further comprising a first source/drain contact structure contacting a surface of the nFET source/drain region, and a second source/drain contact structure contacting a surface of the pFET source/drain region.

9. The semiconductor structure of claim 1, wherein the p-type silicon punch through stop layer has a p-type dopant concentration from 1E17 atoms/cm$^3$ to 1E20 atoms/cm$^3$.

10. The semiconductor structure of claim 5, wherein the n-type doped silicon germanium alloy layer is composed of a phosphorus doped silicon germanium alloy.

11. The semiconductor structure of claim 7, wherein the first gate spacer located above the topmost silicon channel material nanosheet of the nFET nanosheet stack has a topmost surface that is vertical offset, and located above, a topmost surface of the nFET functional gate structure that is located on the topmost silicon channel material nanosheet of the nFET nanosheet stack.

12. The semiconductor structure of claim 11, further comprising a dielectric capping material located on the topmost surface of the nFET functional gate structure that is located on the topmost silicon channel material nanosheet of the nFET nanosheet stack, wherein the dielectric capping material has a topmost surface that is coplanar with the topmost surface of the first spacer.

13. The semiconductor structure of claim 7, wherein the second gate spacer located above the topmost silicon germanium alloy channel material nanosheet of the pFET nanosheet stack has a topmost surface that is vertical offset, and located above, a topmost surface of the pFET functional gate structure that is located on the topmost silicon germanium alloy channel material nanosheet of the pFET nanosheet stack.

14. The semiconductor structure of claim 13, further comprising a dielectric capping material located on the topmost surface of the pFET functional gate structure that is located on the topmost silicon germanium alloy channel material nanosheet of the pFET nanosheet stack, wherein the dielectric capping material has a topmost surface that is coplanar with the topmost surface of the second spacer.

\* \* \* \* \*